(12) United States Patent
Ashrafzadeh

(10) Patent No.: US 8,785,244 B2
(45) Date of Patent: Jul. 22, 2014

(54) WAFER LEVEL PACKAGING USING A LEAD-FRAME

(71) Applicant: Ahmad R. Ashrafzadeh, Morgan Hill, CA (US)

(72) Inventor: Ahmad R. Ashrafzadeh, Morgan Hill, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/689,416

(22) Filed: Nov. 29, 2012

(65) Prior Publication Data

US 2013/0089951 A1   Apr. 11, 2013

Related U.S. Application Data

(63) Continuation-in-part of application No. 13/346,443, filed on Jan. 9, 2012.

(60) Provisional application No. 61/545,491, filed on Oct. 10, 2011.

(51) Int. Cl.
H01L 21/56 (2006.01)

(52) U.S. Cl.
USPC ............ 438/107; 257/E21.499; 257/E21.506; 438/110; 438/111

(58) Field of Classification Search
USPC ........... 257/E21.499, E21.506; 438/107, 110, 438/111
See application file for complete search history.

(56) References Cited

U.S. PATENT DOCUMENTS

| | | | |
|---|---|---|---|
| 5,959,354 A * | 9/1999 | Smith et al. | ................... 257/734 |
| 6,417,575 B2 | 7/2002 | Harada et al. | |
| 6,538,326 B2 | 3/2003 | Shimizu et al. | |
| 6,998,297 B2 | 2/2006 | Schroen | |
| 8,085,553 B1 | 12/2011 | Lacap et al. | |
| 8,106,516 B1 | 1/2012 | Lacap et al. | |
| 2003/0047794 A1 | 3/2003 | Watanabe | |
| 2003/0155642 A1 | 8/2003 | Davis et al. | |
| 2004/0075113 A1 | 4/2004 | Nakayama | |
| 2004/0222504 A1 * | 11/2004 | Schroen | ........................ 257/678 |
| 2005/0017368 A1 | 1/2005 | Mertol et al. | |
| 2007/0007662 A1 | 1/2007 | Shindo et al. | |
| 2010/0072615 A1 | 3/2010 | Samoilov et al. | |

FOREIGN PATENT DOCUMENTS

| | | |
|---|---|---|
| JP | 07-022747 | 1/1995 |
| JP | 10-256722 | 9/1998 |
| JP | 2000-012732 | 1/2000 |
| JP | 2001-358448 | 12/2001 |

OTHER PUBLICATIONS

"Office Action Dated Nov. 25, 2013; U.S. Appl. No. 13/346,443".

* cited by examiner

*Primary Examiner* — Peniel M Gumedzoe
(74) *Attorney, Agent, or Firm* — Blakely Sokoloff Taylor & Zafman LLP

(57) ABSTRACT

Wafer level packaging using a lead-frame. When used to package two or more chips, a final product having QFN package-like finish. The final product will also have a performance rivaling or exceeding that of a corresponding monolithic chip because of the very close connection of the two or more chips and the ability to tailor the fabrication processing of each chip to only that required for the devices on that chip. The wafer level packaging can also be used to package monolithic chips, as well as chips having active devices on one chip and passive devices on a second chip. Various exemplary embodiments are disclosed.

25 Claims, 10 Drawing Sheets

US 8,785,244 B2

WAFER LEVEL PACKAGING USING A LEAD-FRAME

CROSS-REFERENCE TO RELATED APPLICATIONS

This application is a continuation-in-part of U.S. patent application Ser. No. 13/346,443 filed Jan. 9, 2012 which claims the benefit of U.S. Provisional Patent Application No. 61/545,491 filed Oct. 10, 2011.

BACKGROUND OF THE INVENTION

1. Field of the Invention

The present invention relates to the field of integrated circuit packaging.

2. Prior Art

In certain applications it is desirable to package multiple circuits or multiple circuit functions in a single integrated circuit package. One such application is in power regulation wherein a switching regulator controller is desired to be packaged with the power transistors controlled by the controller. Such packaging has been accomplished in the prior art using various techniques. In particular, two separate integrated circuits can be packaged together side by side on a substrate as a multi-chip module, though that is expensive, not of high performance and wastes printed circuit board area. A second approach is to simply stack the two integrated circuits, though that too is expensive as electrical connections from the upper chip must be coupled through the bottom chip, both for connection to the circuit thereon and for connection to the printed circuit board.

Finally, the power transistors and the controller may be fabricated as a single monolithic circuit. This, of course, has the advantage of providing a truly monolithic device, though has certain disadvantages leading to substantially higher costs, which disadvantages can also reduce the performance, particularly of the power transistors. In particular, the controller chip area is normally much smaller than the MOSFET chip area and of course is a much more complex circuit, requiring many more processing steps for the fabrication thereof. The power transistors, on the other hand, are simple structures requiring far fewer processing steps than the controllers. Consequently, when such a monolithic circuit is fabricated the full controller processing is required, though the number of actual controllers fabricated per wafer is far below the number of controllers that would be obtained by the same process by fabricating the controller separately. Further, the power transistors, while not requiring it, are subjected to all the additional steps which can degrade the performance of the power transistors. Accordingly this monolithic solution is particularly expensive.

DETAILED DESCRIPTION OF THE PREFERRED EMBODIMENTS

The present invention is ideally suited to the manufacture of switching regulator integrated circuits, providing a compact and relatively low cost packaging solution. Accordingly the fabrication of switching regulator integrated circuits will be described herein as exemplary of the present invention. However it should be understood that the present invention is not limited to such applications and may be applied to many other applications.

Figure 1:
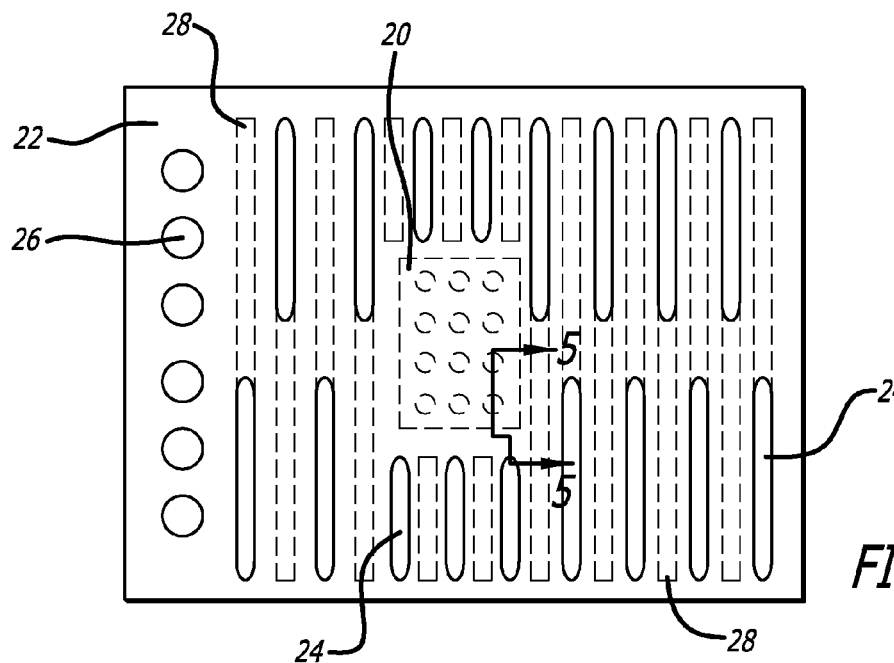
FIGS. 1, 2 and 3 present a bottom view, top view and side view, respectively, of a typical package in accordance with the present invention.
Figure 2:
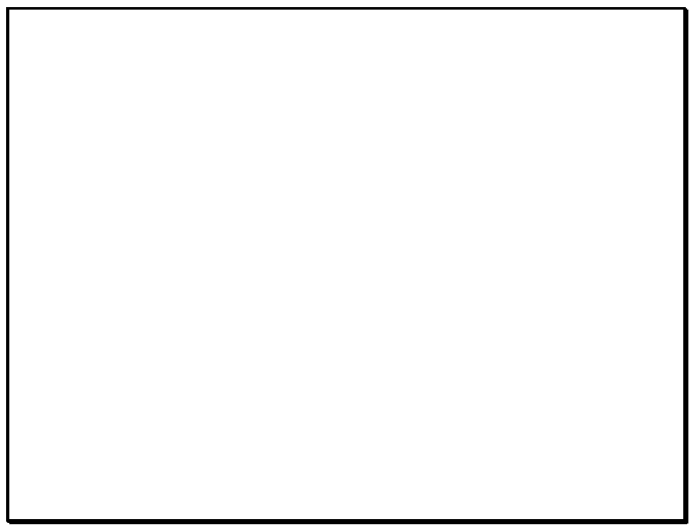
Figure 3:
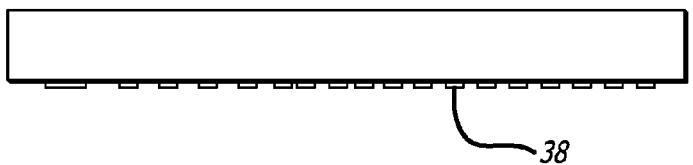

Now referring to FIGS. 1, 2 and 3, a bottom view, top view and side view, respectively, of a typical package in accordance with the present invention may be seen. The package itself is a plastic encapsulation with the elements shown in solid lines within the periphery of the bottom of the package (FIG. 1) being at least flush with, and preferably slightly higher than, the plastic encapsulation, and the regions shown in dashed lines being below or within the encapsulation. In particular, in a switching regulator embodiment as may be seen in FIG. 1, in the center of the bottom of the package is a controller die 20 that is solder ball mounted to the larger power transistor die 22 therebelow. Also visible in FIG. 1 are elongated electrical contacts 24 and a plurality of contacts 26. The parts illustrated in dashed lines, like the controller die 20 and regions 28 of electrical contacts 24, are below the surface of the encapsulation. The top of the package as shown in FIG. 2 is plain with the side of the package shown in FIG. 3 showing solder ball bumps, which as stated, should be at least flush with the bottom surface of the package or preferably extending slightly below the bottom of the molding (FIGS. 2 and 3 do not show the internal parts in dashed lines as in FIG. 1).

The fabrication of the package illustrated in FIGS. 1 through 3 may proceed as follows. Wafers having a matrix of pairs of power transistors are fabricated with the right landing pattern to accept the smaller controller die 20, as are wafers having a matrix of controllers thereon. The controller wafers are then thinned to approximately 200 um using chemical mechanical polishing (CMP). The controller wafer is then diced and the individual controller die 20 are put on the power transistor wafer using a pick and place machine and attached to the larger power transistor die 22 on the wafer, either by reflow soldering or by simply applying heat and pressure, or any other suitable method. In that regard, only exemplary solder ball contacts for the controller die 20 and the power transistor wafer 34 are shown in FIG. 1, as the circuitry itself may be of conventional design as is well known in the prior art and the specific circuitry used is not part of the present invention.

Figure 4:
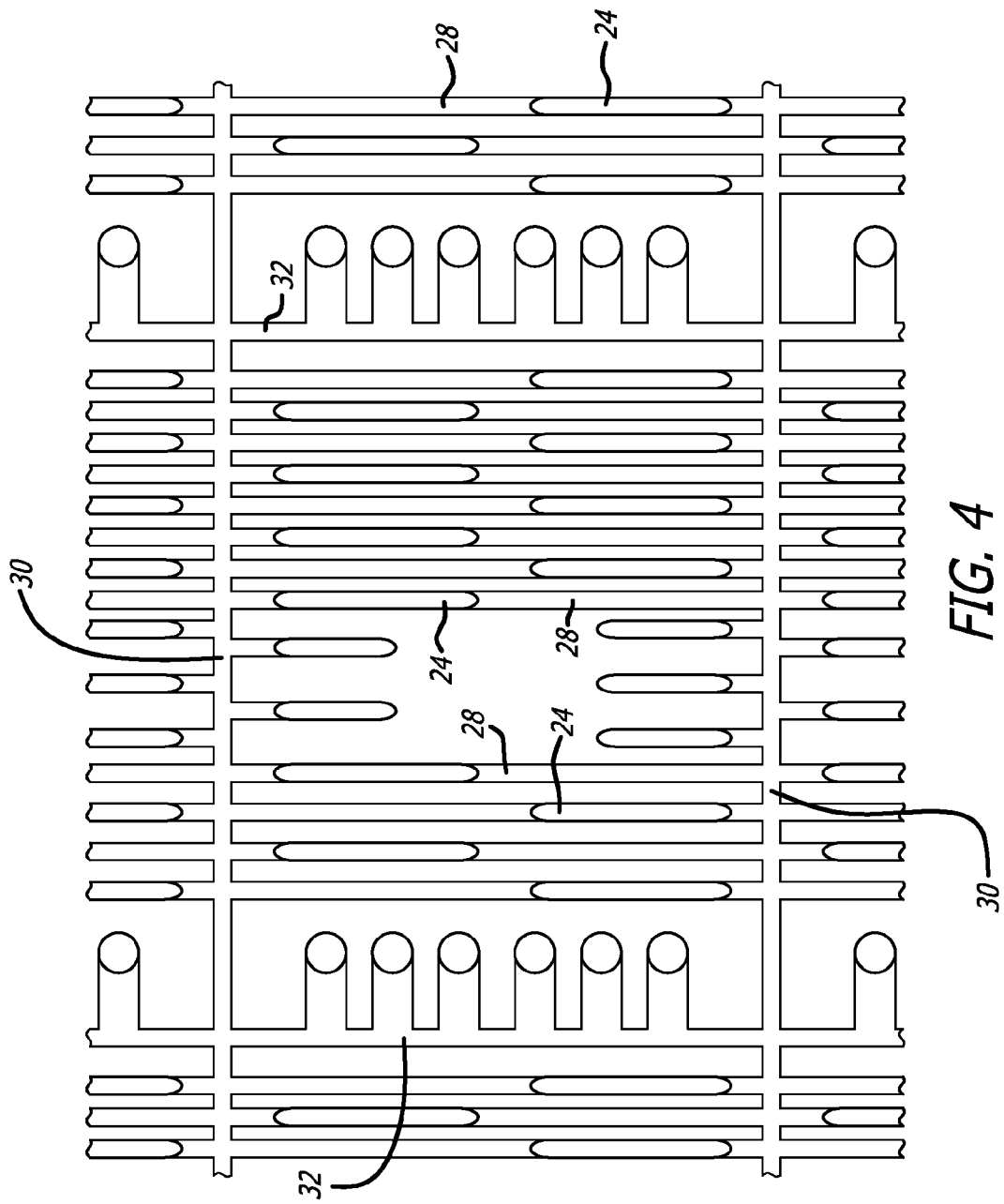
FIG. 4 illustrates an exemplary lead-frame matrix of the present invention.

A lead-frame matrix at least the size of the power transistor die 22 is also fabricated from sheets of lead-frame material, preferably by chemical etching. This defines a plurality of lead-frames in a repetitive horizontal and vertical pattern, as shown in FIG. 4. This Figure illustrates an exemplary lead-frame bounded by horizontal interconnects 30 and vertical interconnects 32, with portions of the adjacent lead-frames integral therewith being shown. The lead-frames are fabricated by first etching part way through the sheet of lead-frame material from one side in the regions 28 shown in dashed lines in FIG. 1, and then etching the rest of the way through the sheet of lead-frame material from the other side to leave the overall pattern shown in FIG. 4. Thus electrical contacts 24 are full thickness regions, whereas regions 28 are thinner regions, such as by way of example, one-half the thickness of the original sheet of lead-frame material. The horizontal interconnects 30 and vertical interconnects 32 are preferably thinned, but may be left at the original thickness, as desired.

The power transistor wafer is now ready for a batch process. This process may or may not use a redistribution layer, called RDL. The RDL has two advantages, one is to reduce metal resistance when put in parallel with thin aluminum layers and the other is to allow movement of the contact pads to a convenient location. If RDL is not used, the wafer will go through a bump process, which could be done by either placing balls on the wafer, by plating small bumps on the pads or by use of a stencil where solder paste is placed on the bump pads. Once the bumps are placed on the wafer, the lead-frame matrix, which matches the pad locations, is placed on the wafer and attached either by a reflow process or by heat and pressure or some other suitable method.

With the wafer and lead-frame attached, one can continue by half-etching the lead-frame to remove the unnecessary metal where metal does not need to exist, or cannot exist, such as in the lead-frame matrix interconnects 30 and 32 of FIG. 4. The process continues by filling the gaps between the whole structure with polyimide 36 (FIG. 5) or similar material for overall package integrity and passivation. The surface is then ground to expose the lead-frame again and followed by plating the lead-frame with solder alloy 38 (FIG. 5) to provide solderability. As an alternative to polyimide, one might mold the top of the entire wafer as is done for some other packages, and perhaps in a manner that prevents the mold from covering the lead-frame contacts so as to eliminate the grinding step.

This wafer can now be tested in wafer form, a much lower cost process than testing individual parts, and then diced to separate the finished parts.

It should be noted that the thermal expansion rate of the lead-frame material will be substantially greater than the thermal expansion rate of the integrated circuits. While this is not a problem over the dimensions of a single lead-frame, it can be a problem over the dimensions of a wafer. If differential expansion during bonding the lead-frame matrix to the wafer is a problem, then various solutions are available. One alternative method is to pattern the lead-frame to final shape (i.e. individual lead-frames separated) while attached to a surface of a temporary substrate through adhesion. By using a temporary substrate with an expansion rate matching silicon, the thermal expansion issue that might exist if a reflow process is used to attach the lead-frame matrix is eliminated. In particular, one can etch away the lead-frame material to separate the lead-frames, so that the spacing between lead-frames will now be determined by the expansion rate of the temporary substrate, not the expansion rate of the lead-frame material itself. Using this technique, the lead-frame ends will not show in the side view of FIG. 3, but will terminate just within the side, as illustrated in FIG. 1.

Figure 5:
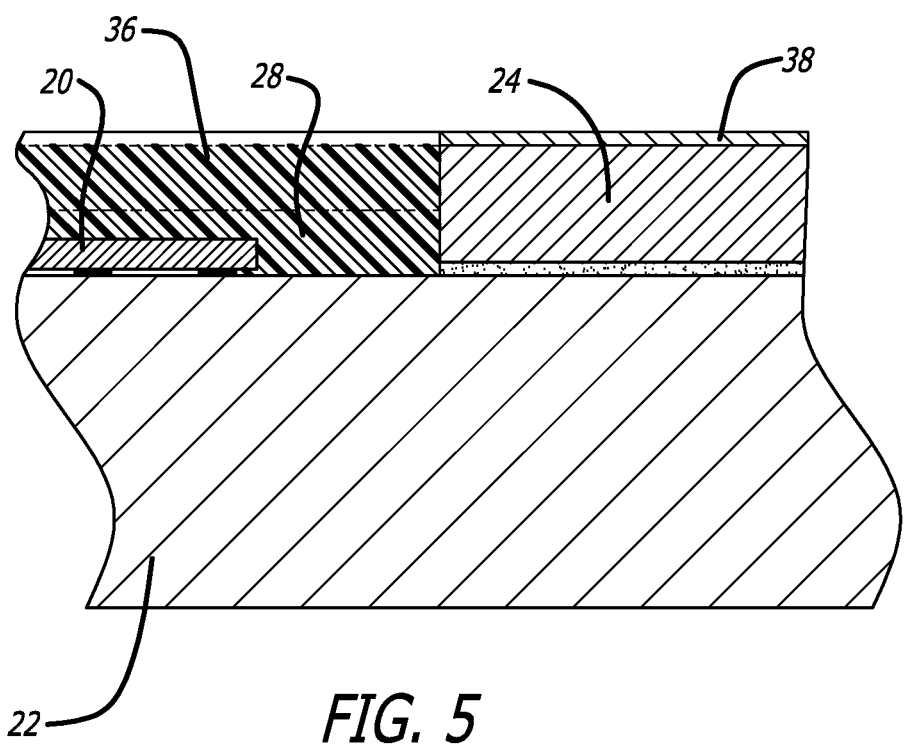
FIG. 5 is a cross section taken along broken line 5-5 of FIG. 1.

A local cross section of the finished package taken along broken line 5-5 of FIG. 1 may be seen in FIG. 5. This cross section illustrates the relative levels of the power transistor die 22, the controller die 20 as thinned and solder ball or otherwise mounted on the power transistor chip, one of the elongated electrical contacts 24, and a region 28 of another elongated electrical contact in the background (below the dashed line), the polyimide encapsulation 36 and the solder alloy 38 on the elongated electrical contact 24 and on another elongated electrical contact 24 in the background. As can be seen therein, the controller die 20 is well within the surface of the polyimide encapsulation, and is shown in FIG. 5 as being thinner than the electrical regions 28. Preferably these two thicknesses will be approximately the same, as there is no reason to thin the controller die 20 further. Also while not mentioned earlier, the electrical regions 28 provide current collection from the field effect transistors thereunder, and are used in place of using electrical contacts 24 that span the entire power transistor die 22 to provide the necessary separation between electrical contacts 24 as shown in FIG. 1 for solder mounting of the package onto a printed circuit board without risk of the solder shorting contacts together.

Accordingly, wafer level processing can be modified to put the lead-frame on the wafer such that the finish and the interconnects are the lead-frame instead of the bumps as in wafer level packaging (WLP). This keeps the cost down since this is a batch process and is done at wafer level, but will result in a QFN package-like finish and performance. This invention provides the best cost/performance in making power devices as well as other devices where WLP is not acceptable. Additionally, this process can marry a small die onto a big die in a wafer before the packaging process to make more complex products where two different processes need to coexist to make a more complex product. In the case of power management, this can be a driver, or a controller that is used to control discrete power transistors. This will eliminate the need for implementing high performance power transistors in complex processes to further reduce cost. Similar approaches can be used in other applications, such as RF where passive devices can be married to an RF chip.

Figure 6:
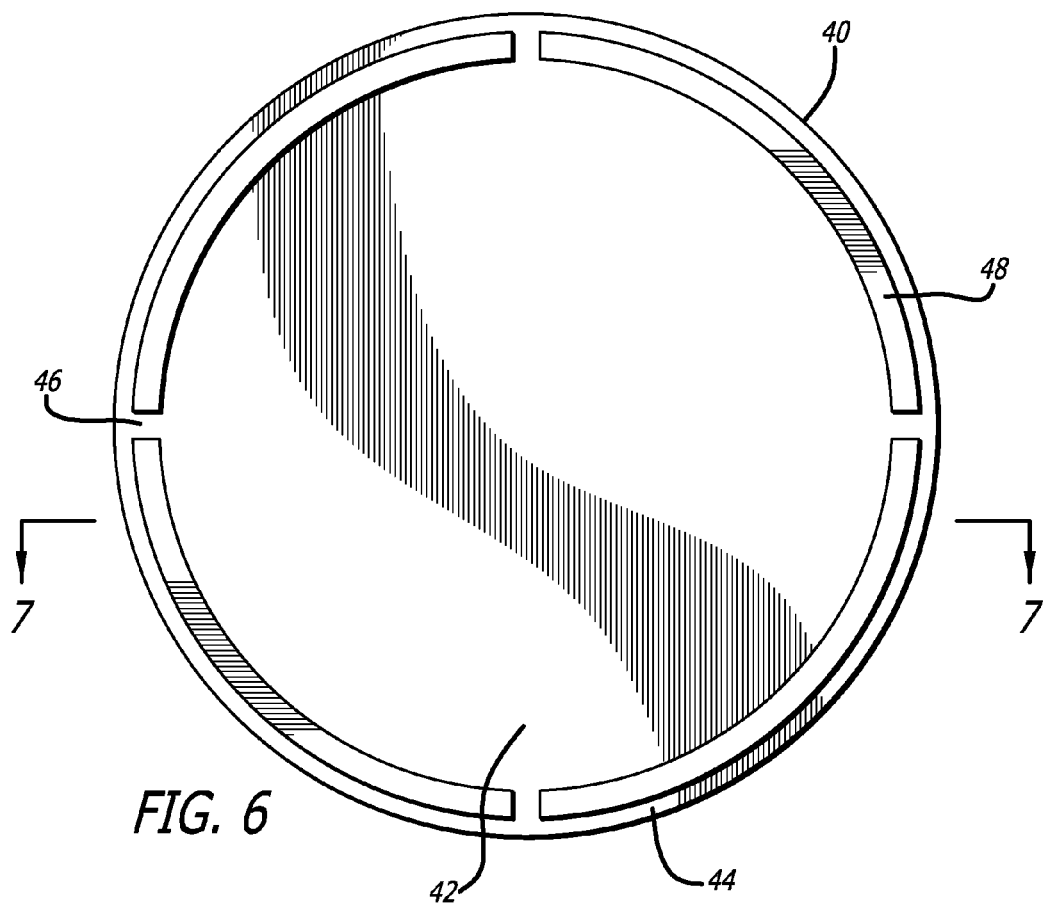
FIG. 6 is a schematic face view of a fixture which may be used with certain embodiments of the present invention.
Figure 7:
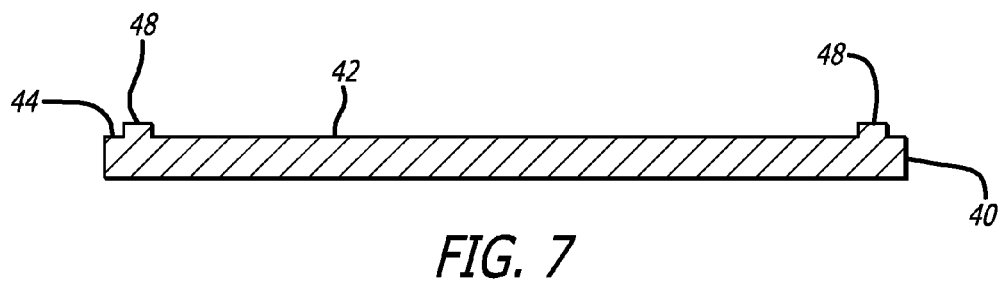
FIG. 7 is a schematic cross section of the Figure of FIG. 6.
Figure 8:
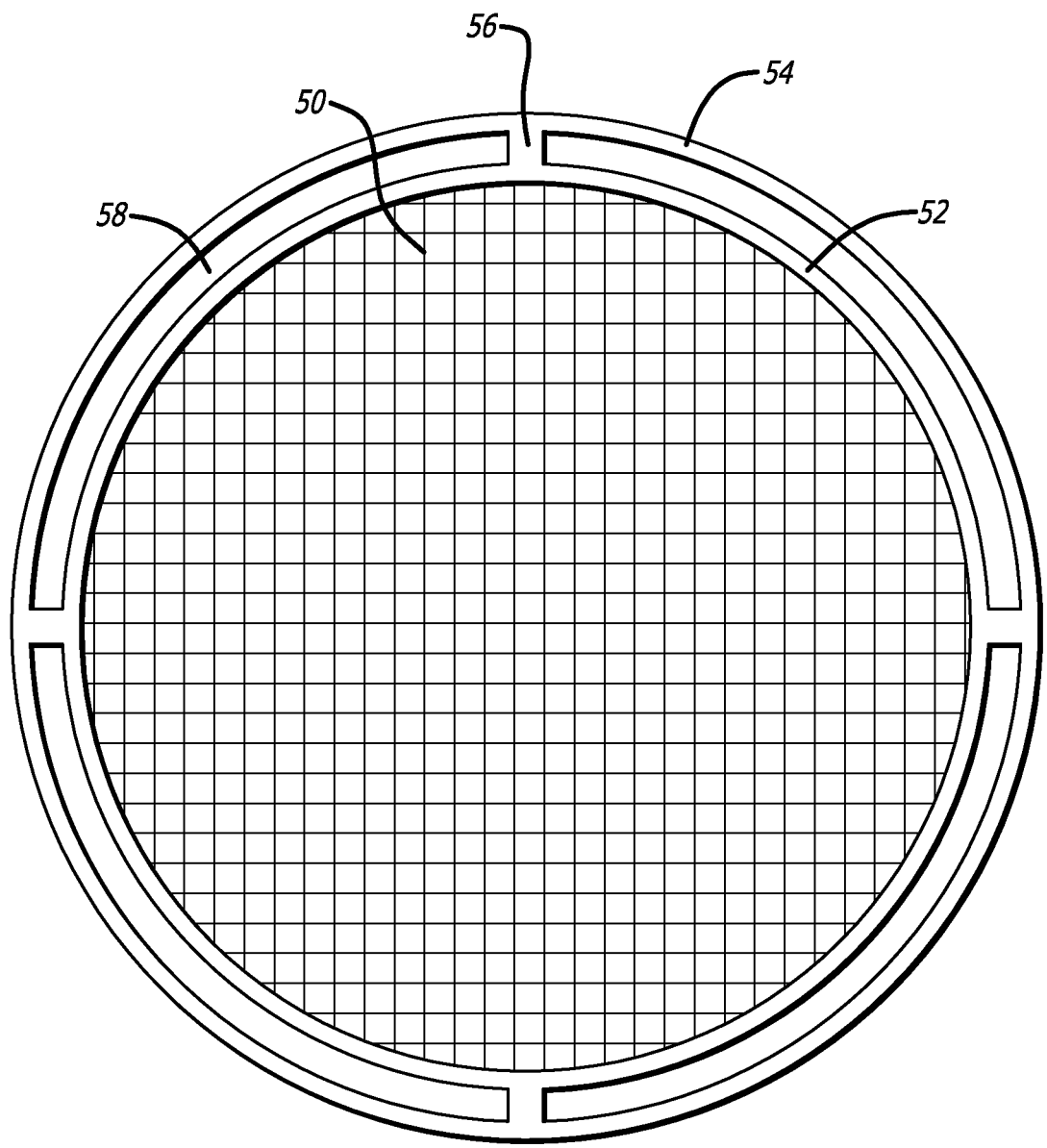
FIG. 8 is a schematic illustration of an exemplary full lead-frame matrix for use with the fixture of FIGS. 6 and 7.

Now referring to FIGS. 6 and 7, a face view and a cross section of a fixture which may be used with certain embodiments of the present invention may be seen. In particular, a substrate 40 has etched areas 42 and 44 with etched areas 46 therebetween. This leaves regions 48 being higher than etched areas 44 and 42. This fixture, by way of example, may be used with a lead-frame matrix like that very schematically illustrated in FIG. 8. Here a matrix of lead-frames 50 are integrally attached to a ring 52, which in turn is integrally attached to an outer ring 54 by integral connecting regions 56. Open regions 58, on the other hand, are open regions which, like portions of the lead-frame matrix, have been etched all the way through the lead-frame material. Thus the lead-frame matrix shown in FIG. 8 is proportioned in conjunction with the fixture of FIGS. 6 and 7 so that regions 48 on the fixture just fit within the open regions 58, with connecting regions 56 fitting within etched areas 46 of the fixture for alignment of the lead-frame matrix. Etched areas 44 of the fixture and outer ring 54 of the lead-frame matrix are primarily for handling purposes. The material of the substrate 40 from which the fixture of FIGS. 6 and 7 is fabricated is selected to have a thermal expansion rate closely matching that of silicon (much less than the expansion rate of the lead-frame material), with regions 48 preferably extending upward between etched areas 44 and 42 by no more than the thickness of the thickest part of the lead-frame matrix.

In use, the lead-frame matrix of FIG. 8 is placed over the fixture of FIGS. 6 and 7 with regions 48 extending into open regions 58 of the lead-frame matrix, with inner ring 52 being a close fit to the inner surface of the regions 48 of the fixture. This restrains the thermal expansion rate of the lead-frame matrix to the expansion rate of the fixture, the fixture itself being much stronger (thicker) than the lead-frame matrix. Consequently, when the lead-frame in the fixture is placed over the wafer and heated with the wafer for reflow soldering of the lead-frame matrix to the contact areas on the wafer, the lead-frame expansion rate will be limited to the expansion rate of the fixture, and thus substantially equal to the expansion rate of the wafer. Of course, certain lead-frame areas, such as those only supported from one location on the lead-frame, will expand at the rate of the lead-frame material, though the differential expansion between the lead-frame material and the wafer will not accumulate across the full dimensions of the wafer. Thus when the wafer, fixture and lead-frame are heated for reflow soldering, everything will expand at the same rate, and similarly, contract at the same rate while cooling, at least until the solder sets to the point that the lead-frame matrix and wafer are fused together, after which the lead-frame and wafer will contract at the same rate when further cooling to ambient temperature.

If one uses a lead-frame matrix of the general type illustrated in FIG. 4, with horizontal and vertical interconnects 30 and 32 holding the matrix together until the wafer is diced, there is a problem in removing interconnects 30 and 32 to remove the short circuits they would cause. One approach for achieving this would be to use members that are thinner than the dicing saw and to cut along such members. This is believed likely to not be practical because of the very small thickness of typical dicing saws, the inability to use matrix supporting members that are that thin while maintaining some structural integrity in the lead-frame matrix, and finally, because of the inability to sufficiently accurately locate those structural members at the exact position that will be used by the dicing saw. Of course, a thicker dicing saw or parallel blades in the saw could be used, though this means that a larger portion of the wafer area would be lost to the saw cuts.

Figure 9:
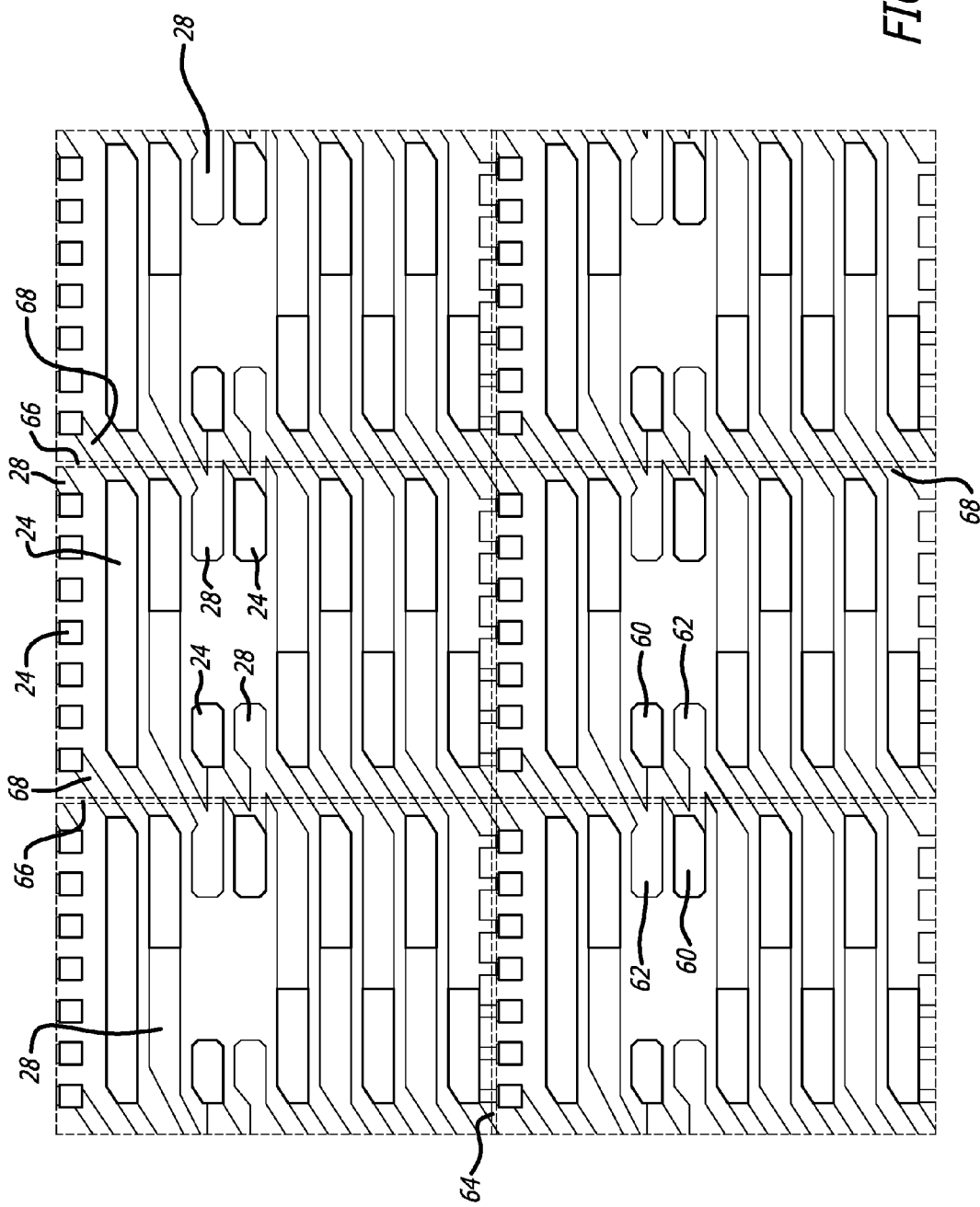
FIG. 9 illustrates an alternate form of lead-frame matrix which allows the use of the full lead-frame matrix without removal of the interconnect before dicing, yet allows dicing in a conventional manner using a saw of standard thickness to both dice the wafer and separate the individual lead-frame in a manner that cuts all potential shorts in the finished package.

Accordingly, FIG. 9 illustrates an alternate form of lead-frame matrix which allows the use of the full lead-frame matrix without removal of the interconnect before dicing, yet allows dicing in a conventional manner using a saw of standard thickness to both dice the wafer and separate the individual lead-frame in a manner that cuts all potential shorts in the finished package.

As may be seen in FIG. 9, electrical contacts 24 (all areas encircled in bolder lines) are full thickness lead-frame areas whereas regions 28 (all areas encircled in lighter lines) are half thickness areas. Certain regions, namely regions 60, are supported with respect to each other through a half thickness interconnect, and further are each supported to adjacent regions 62, whereas other regions are generally supported by diagonal interconnects, or in some cases by vertical interconnects. Without these further interconnects, regions 60 would be supported with respect to each other, though not supported with respect to the remaining lead-frame matrix.

The lead-frame matrix shown in FIG. 9 does not have any horizontal interconnects straight across the matrix, and further does not have vertical interconnects extending all the way down the lead-frame matrix. Instead, the interconnects 68 are angled. Accordingly the lead-frame matrix will exhibit some flexibility so that when incorporated into an overall lead-frame matrix, as shown in FIG. 8 and used in conjunction with the fixture of FIGS. 6 and 7, the lead-frame matrix will easily deflect to accommodate the differential expansion between the lead-frame matrix and the fixture. Further, an advantage of the lead-frame matrix shown in FIG. 9 is that horizontal saw cuts across the final wafer assembly, schematically illustrated as saw cuts 64 and vertical saw cuts 66 in the completed wafer, will not only dice the wafer but will electrically separate all regions that need to be electrically separated so that a conventional dicing saw may be used to achieve the desired result.

Still another approach which might be used would be to use a lead-frame matrix such as that shown in FIG. 4 in an overall matrix similar to that shown in FIG. 8, but with a much greater number of connecting regions 56 and a corresponding much greater number of etched areas 46 in the fixture of FIGS. 6 and 7. By appropriately proportioning the overall lead-frame matrix and fixture, the lead-frame matrix may be given an interference fit on the outer diameter of regions 48 on the fixture. In this case the lead-frame may be heated and/or the fixture cooled to the extent that the lead-frame matrix will fit onto the fixture. Now when the fixture and lead-frame matrix reach the same temperature the lead-frame matrix will be in tension (slightly stretched), which tension will decrease as the fixture and lead-frame are heated to the solder reflow temperature during the joining of the lead-frame matrix to the wafer. This tension will hold horizontal and vertical interconnects running all the way across the wafer straight, thereby avoiding any distortion of the lead-frame matrix prior to or during reflow soldering of the lead-frame matrix to the wafer. However such a technique has the disadvantage of again requiring a thicker saw or parallel saw blades to remove the horizontal and vertical interconnects 30 and 32 so as to separate areas that should be electrically isolated from each other. Again, it may not be practical to use horizontal and vertical interconnects 30 and 32 that are sufficiently narrow and can be sufficiently accurately located for dicing purposes to remove the same using a dicing saw of a conventional thickness.

Figure 10:
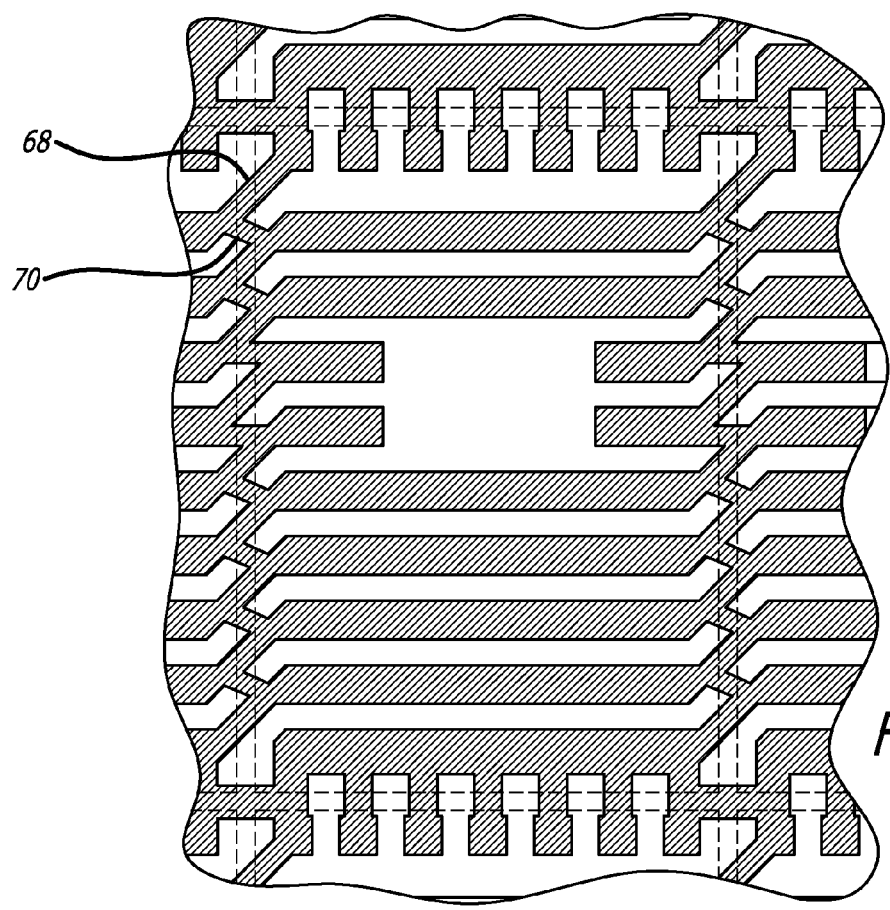
FIG. 10 illustrates a further alternate form of lead-frame matrix which allows the use of the full lead-frame matrix without removal of the interconnect before dicing, yet allows dicing in a conventional manner using a saw of standard thickness to both dice the wafer and separate the individual lead-frame in a manner that cuts all potential shorts in the finished package.

Now referring to FIG. 10, a portion of a lead frame matrix similar to that of FIG. 9 may be seen. This lead frame matrix may be substantially identical to that of FIG. 9 (the half thickness regions are not shown in FIG. 10), but differs from FIG. 9 only in that downwardly angled interconnects 70 are included in addition to the interconnects 68, which slant upward to the right. The effect of this difference is that the elements of the lead frame matrix are better tied together to provide more structure to the lead frame matrix, yet still eliminates the purely horizontal and vertical interconnects 30 and 32 of the embodiment of FIG. 4. Thus this lead frame matrix will also exhibit some flexibility, primarily in the interconnect region, so as to easily deflect to accommodate the differential expansion between the lead frame matrix and the fixture. Preferably the interconnects are proportioned and angled to provide a sort of isotropic flexibility to avoid any undesired movement of the regions which will become part of the finished package. Again, the interconnects 68 and 70 of the lead frame matrix are preferably carefully positioned with respect to the dicing saw cuts so that on dicing to separate the individual packages, each separate conductive area of the lead frame will in fact be electrically separated from each other conductive area.

Figure 11:
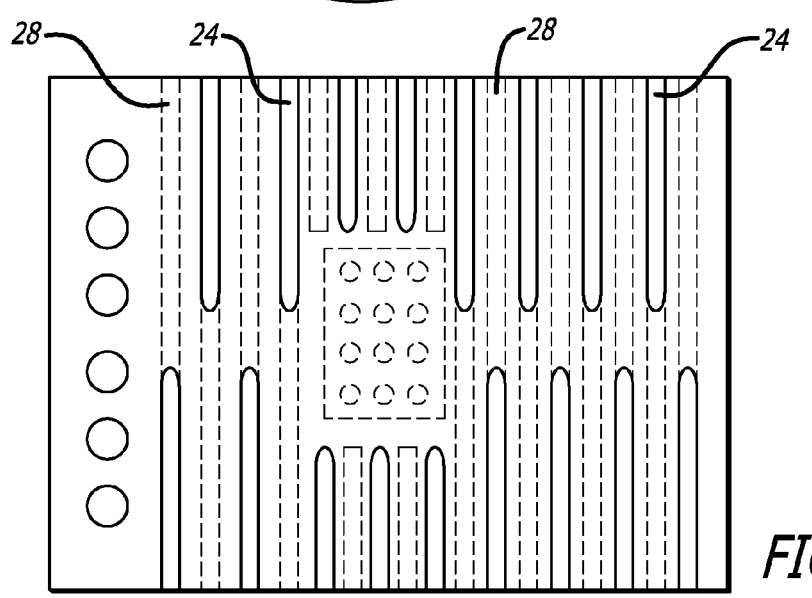
FIGS. 11 and 12 illustrate an embodiment that is an alternate to the embodiment of FIGS. 1 through 3.
Figure 12:
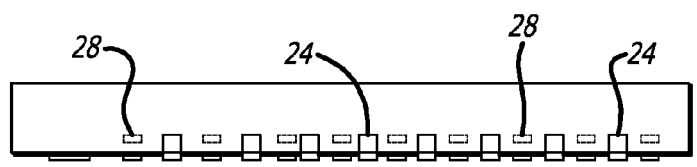

In the embodiment of FIGS. 1-3, the half thickness regions 28 and the full thickness regions 24 did not extend to the edge of the package, which configuration could be fabricated by temporarily fastening the lead frame matrix to a temporary substrate and etching away the interconnects etc. to result in the pattern of conductors shown in FIG. 1. Alternatively, the half thickness conductive regions 28 and the full thickness conductive regions 24 may be brought out to the edge of the package as shown in FIG. 11. Accordingly FIG. 12, which is a view effectively looking down at the upper edge of the package of FIG. 11, will show the full thickness regions 24 as well as the half thickness regions 28 coming all the way to the edge of the package. Such a configuration is easier to fabricate, as no temporary substrate is required and may have the advantage of making the final solder joints to a printed circuit board visible to be more readily inspected.

Figure 13A:
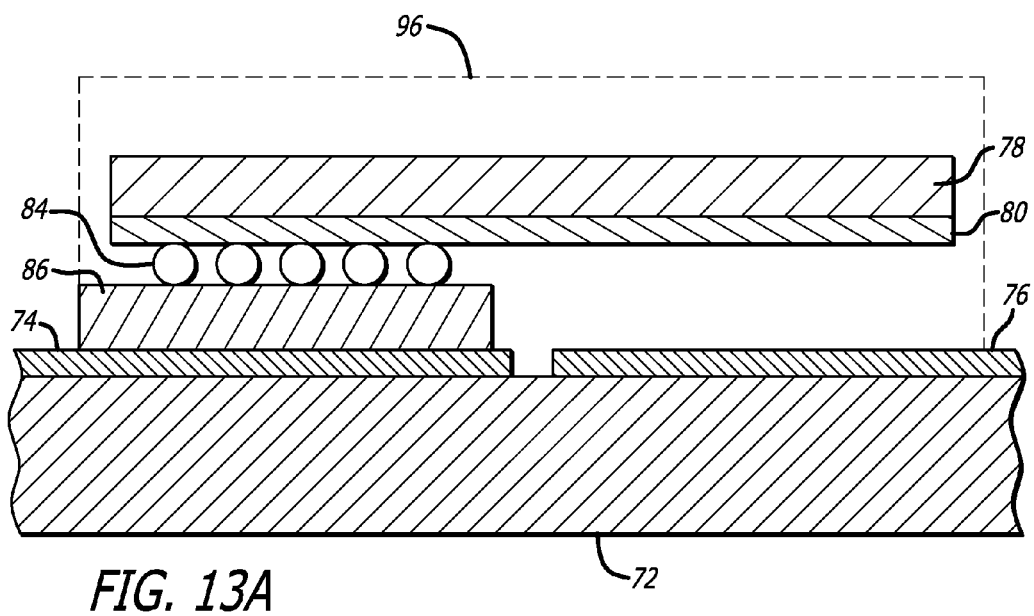
FIGS. 13A and 13B are schematic cross sections of another embodiment of the invention.
Figure 13B:
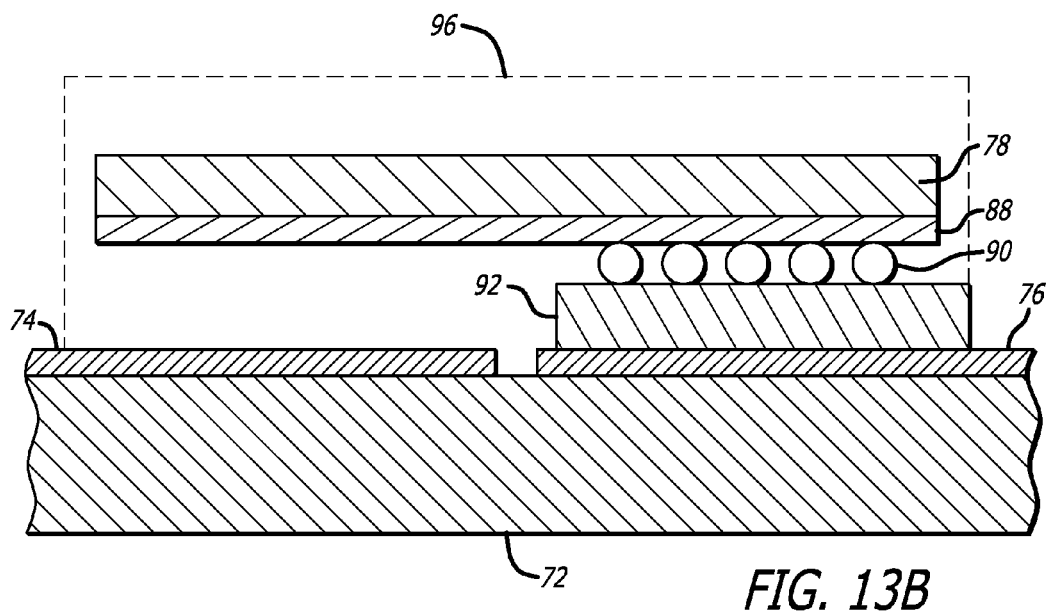

Now referring to FIGS. 13A and 13B, a cross section of an alternate embodiment as mounted on a printed circuit board may be seen. In these Figures the encapsulation 96 is shown in phantom, as the encapsulation occurs after soldering the wafer to the lead from. Also the lead frame portions 86 and 92 are shown at the side as they would be cut during dicing of the wafer after the encapsulation. The package is mounted on printed circuit board 72 having printed circuit portions 74 and 76 thereon. The chip 78, which in the embodiments disclosed would comprise a power transistor chip, has a plurality of redistribution layers 80 and 82 (source and drain contacts) accessible from the top of the chip as fabricated, and as part of the flip-chip, now accessible from the bottom of the chip as shown in FIGS. 13A and 13B. Redistribution layers 80 (FIG. 13A) are soldered using solder balls 84 to a lead frame portion 86, which in turn will be soldered to the printed circuit portion 74 on the printed circuit board 72. Redistribution layers 88 (FIG. 13B) are soldered using solder balls 90 to a lead frame portion 92, which in turn will be soldered to the printed circuit portion 76 on the printed circuit board 72. In essence, this embodiment does not contain the half thickness regions of the earlier embodiments, and accordingly, the lead frame's current carrying capacity across the width of the chip is not utilized. Instead, however, robust redistribution layers 80 and 88 are provided on the chip 78 provide the lateral conduction needed without the use of an extension of the electrical contacts formed by the lead frame portions 84 and 86.

Figure 14:
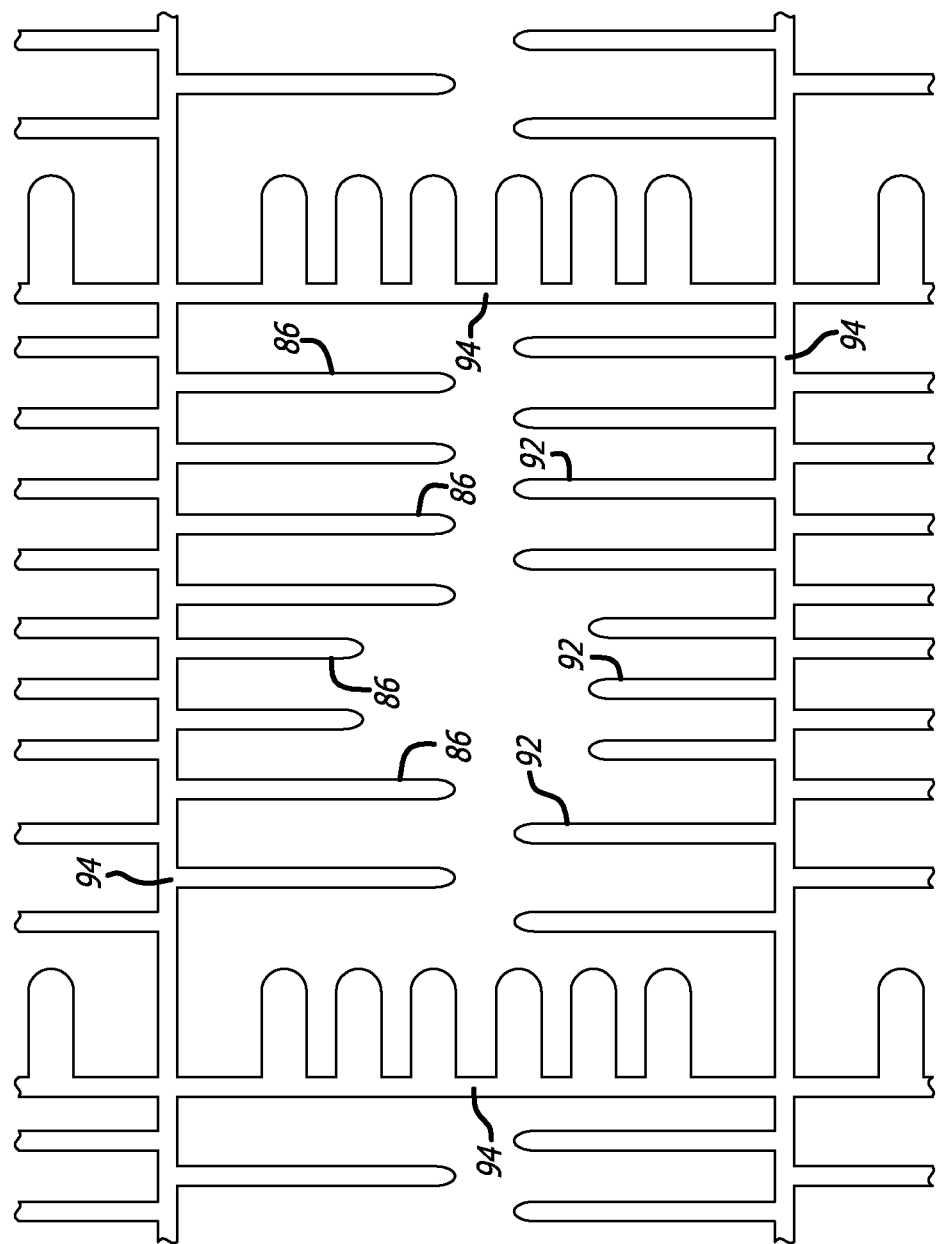
FIG. 14 presents an exemplary lead frame for use with the embodiment of FIGS. 13A and 13B.
Figure 15:
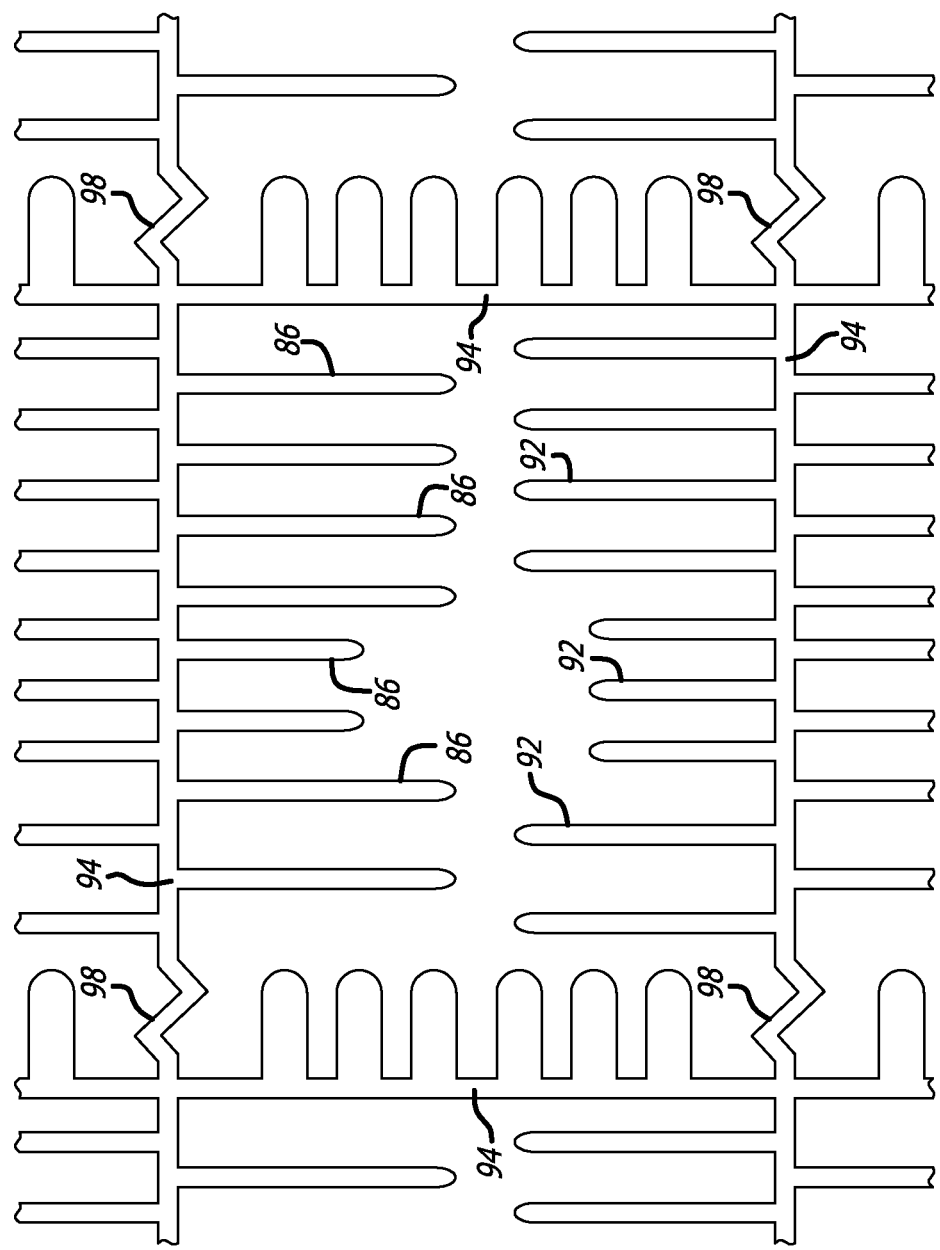
FIG. 15 presents an exemplary lead frame similar to that of FIG. 14, but further including some elasticity to absorb differential expansion.

An exemplary lead frame matrix for this embodiment is illustrated in FIG. 14. This lead frame matrix is similar to that of FIG. 4, though with some important differences. As shown in FIGS. 13A and 13B, lead frame portions 86 and 92 extend inward from the lead frame borders 94 and do not have any of the half thickness regions of the prior embodiments. Also they extend inward less than half the width of the lead frame, and thus do not extend inward from the lead frame borders 90 so much as to be interleaved, that is, to have the tips of either lead frame portions 86 or 92 extend to a position between the tips of the other lead frame 92 or 86. This, of course, has the advantage of eliminating one step in the manufacturing process, thereby reducing costs, though not substantially impacting performance of the packaged power transistors with or without the controller as previously described. In that regard, fabrication of the package using wafer level packaging of this embodiment may proceed as described with respect to the previously described embodiments, including embodiments wherein the controller chip is packaged with the power transistor chip, which descriptions are hereby incorporated as if set forth in detail herein with respect to this embodiment. Similarly, the lead frame matrix may be altered if desired to provide some elasticity in the matrix forming the boundary of each individual lead frame to allow for differential expansion when soldering the lead frame portions 86 and 92 to the redistribution layers 80 and 88 respectively. This is shown in FIG. 15 wherein regions 98 provide the elasticity. In that regard, the elasticity in each lead frame need only be that used by that lead frame for differential expansion, as the expansion of the lead frame matrix in any direction will be accommodated by the cumulative elasticity of all lead frames in that direction of the lead frame matrix.

There has been described herein wafer level packaging techniques using a lead-frame so that the finish and interconnects of the final package are lead-frame instead of bumps, as in conventional wafer level packaging. This will keep the cost of the final product down, since this is a batch process and done at the wafer level, but will result in a QFN (quad-flat leads) package-like finish and performance.

The present invention has been disclosed and described with respect to embodiments wherein one chip of power transistors for a switching power supply and a controller chip for the switching power supply are packaged together. However it should be noted that monolithic (single) chips may be packaged in accordance with the present invention, as may be multiple chips in excess of two chips, should the need or application arise. In that regard, as to the exemplary embodiments having been described with respect to the packaging of two chips having active devices thereon (the power transistors on one chip and a controller on a second chip), it should be noted that the same packaging technique can be used for packaging of two or more chips wherein at least one chip contains active devices and at least one chip only contains passive devices. In any event, the present invention, when used to package two or more chips as in the exemplary embodiment, will result in a final product having a performance rivaling or exceeding that of a corresponding monolithic chip is achieved because of the very close connection of the two or more chips and the ability to tailor the fabrication processing of each chip to only that required for the devices on that chip.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of wafer level packaging comprising:
  a) fabricating a first wafer with a repetitive matrix of first circuits thereon and having a corresponding pattern of circuit contacts formed by a plurality of redistribution layers accessible from a first surface thereof;
  b) fabricating a lead frame matrix having a repetitive pattern of lead frames and lead frame portions for electrically connecting to the circuit contacts on the first wafer, each lead frame including a plurality of lead frame portions extending toward each other from opposite sides of the lead frame, the lead frame portions extending less than half way across the lead frame so that tips of lead frame portions from one side of the lead frame do not extend between tips of the lead frame portions from the other side of the lead frame;
  c) electrically connecting the lead frame portions on the lead frame matrix to the circuit contacts on the first wafer;
  etching the lead frame matrix to separate the lead frame portions;
  d) dicing the first wafer.

2. A method of wafer level packaging comprising:
a) fabricating a first wafer with a repetitive matrix of first circuits thereon and having a corresponding pattern of circuit contacts formed by a plurality of redistribution layers accessible from a first surface thereof;
b) fabricating a lead frame matrix having a repetitive pattern of lead frames and lead frame portions for electrically connecting to the circuit contacts on the first wafer, each lead frame including a plurality of lead frame portions extending toward each other from opposite sides of the lead frame, the lead frame portions extending less than half way across the lead frame so that tips of lead frame portions from one side of the lead frame do not extend between tips of the lead frame portions from the other side of the lead frame;
attaching the lead frame matrix to a temporary substrate, etching the lead frame matrix to separate the lead frame portions
electrically connecting the lead frame portions to the circuit contacts on the first wafer and removing the temporary substrate;
d) dicing the first wafer.

3. A method of wafer level packaging comprising:
a) fabricating a first wafer with a repetitive matrix of first circuits thereon and having a corresponding pattern of circuit contacts formed by a plurality of redistribution layers accessible from a first surface thereof;
b) fabricating a lead frame matrix having a repetitive pattern of lead frames and lead frame portions for electrically connecting to the circuit contacts on the first wafer, each lead frame including a plurality of lead frame portions extending toward each other from opposite sides of the lead frame, the lead frame portions extending less than half way across the lead frame so that tips of lead frame portions from one side of the lead frame do not extend between tips of the lead frame portions from the other side of the lead frame;
c) electrically connecting the lead frame portions on the lead frame matrix to the circuit contacts on the first wafer;
coating the lead frame matrix with a polymer;
grinding the exposed surface of the polymer to expose package contacts on the opposite side of the lead frame portions;
d) dicing the first wafer.

4. The method of claim 3 further comprising plating the package contacts with solder alloy before d).

5. The method of claim 3 wherein the lead frame matrix is fabricated to have flexibility to accommodate the differential expansion between the lead frame matrix and the first wafer.

6. The method of claim 5 wherein electrically connecting the lead frame portions on the lead frame matrix to the circuit contacts on the first wafer comprises soldering the lead frame portions on the lead frame matrix to the circuit contacts on the first wafer, and wherein the lead frame matrix is restrained against expansion when being heated for soldering.

7. The method of claim 5 wherein the lead frame is fabricated so that the lead frame portions are electrically separated by the dicing.

8. A method of wafer level packaging comprising:
a) fabricating a first wafer with a repetitive matrix of first circuits thereon and having a corresponding pattern of circuit contacts formed by a plurality of redistribution layers accessible from a first surface thereof;
b) fabricating a lead frame matrix having a repetitive pattern of lead frames and lead frame portions for electrically connecting to the circuit contacts on the first wafer, each lead frame including a plurality of lead frame portions extending toward each other from opposite sides of the lead frame, the lead frame portions extending less than half way across the lead frame so that tips of lead frame portions from one side of the lead frame do not extend between tips of the lead frame portions from the other side of the lead frame;
c) electrically connecting the lead frame portions on the lead frame matrix to the circuit contacts on the first wafer;
fabricating a second wafer having a matrix of second circuits thereon;
thinning the second wafer;
dicing the second wafer to form individual second circuits, each second circuit having an area that is less than the area of each first circuit;
placing a second circuit on each of the first circuits and electrically connecting the first and second circuits;
d) dicing the first wafer.

9. The method of claim 8 wherein the second circuits are placed on the first circuits and electrically connected to the first circuits before c).

10. The method of claim 8 wherein fabricating a lead frame matrix comprises fabricating a repetitive pattern of lead frames and lead frame portions for electrically connecting to the circuit contacts on the first wafer in areas not occupied by the second circuits.

11. The method of claim 10 wherein the first and second circuits are electrically connected by either reflow soldering or heat and pressure.

12. The method of claim 10 further comprising, after c), etching the lead frame matrix to separate the lead frame portions.

13. The method of claim 10 wherein the lead frame matrix is fabricated to have flexibility to accommodate the differential expansion between the lead frame matrix and the first wafer.

14. The method of claim 13 wherein electrically connecting the lead frame portions on the lead frame matrix to the circuit contacts on the first wafer comprises soldering the lead frame portions on the lead frame matrix to the circuit contacts on the first wafer, and wherein the lead frame matrix is restrained against expansion when being heated for soldering.

15. The method of claim 13 wherein the lead frame is fabricated so that the lead frame portions are electrically separated by the dicing.

16. The method of claim 13 wherein the first and second circuits are electrically connected by either reflow soldering or heat and pressure.

17. The method of claim 8 wherein the first circuits are switching transistors for a switching regulator, and the second circuits are switching regulator controllers.

18. A method of wafer level packaging comprising:
fabricating a first wafer with a repetitive matrix of first circuits thereon and having a corresponding pattern of circuit contacts on a first surface thereof;
fabricating a second wafer having a matrix of second circuits thereon;
thinning the second wafer;
dicing the second wafer to form individual second circuits, each second circuit having an area that is less than the area of each first circuit;
placing a second circuit on each of the first circuits and electrically connecting the first and second circuits;
fabricating a lead frame matrix having a repetitive pattern of lead frames and lead frame portions for electrically connecting to the circuit contacts on the first wafer in areas not occupied by the second circuits, each lead frame including a plurality of lead frame portions extending toward each other from opposite sides of the lead frame, the lead frame portions extending less than half way across the lead frame so that tips of lead frame portions from one side of the lead frame do not extend between tips of the lead frame portions from the other side of the lead frame;

electrically connecting the lead frame portions on the lead frame matrix to the circuit contacts on the first wafer;

coating the first and second circuits with a polymer, the polymer not covering package contacts on the lead frame matrix; and dicing the first wafer and lead frame matrix.

19. The method of claim 18 further comprising attaching the lead frame matrix to a temporary substrate, etching the lead frame matrix to separate the lead frame portions, then electrically connecting the lead frame portions to the circuit contacts on the first wafer and removing the temporary substrate.

20. The method of claim 18 wherein at least part of the lead frame matrix forms at least one of the package contacts.

21. The method of claim 20 further comprising plating the package contacts with solder alloy before dicing.

22. The method of claim 20 wherein, after electrically connecting the lead frame portions on the lead frame matrix to the circuit contacts on the first wafer, etching the lead frame matrix to electrically separate leads of the lead frame.

23. The method of claim 18 wherein the lead frame matrix is fabricated to have flexibility to accommodate the differential expansion between the lead frame matrix and the first wafer.

24. The method of claim 23 wherein electrically connecting the lead frame portions on the lead frame matrix to the circuit contacts on the first wafer comprises soldering the lead frame portions on the lead frame matrix to the circuit contacts on the first wafer, and wherein the lead frame matrix is restrained against expansion when being heated for soldering.

25. The method of claim 23 wherein the lead frame is fabricated so that the lead frame portions are electrically separated by the dicing.

* * * * *